United States Patent
Stachowiak et al.

(10) Patent No.: US 12,428,508 B2
(45) Date of Patent: Sep. 30, 2025

(54) PHOTOCURABLE COMPOSITION INCLUDING A NON-REACTIVE POLYMER

(71) Applicant: CANON KABUSHIKI KAISHA, Tokyo (JP)

(72) Inventors: Timothy Brian Stachowiak, Austin, TX (US); Fen Wan, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 655 days.

(21) Appl. No.: 17/650,676

(22) Filed: Feb. 11, 2022

(65) Prior Publication Data
US 2023/0257496 A1    Aug. 17, 2023

(51) Int. Cl.
| | | |
|---|---|---|
| C08F 120/18 | (2006.01) | |
| C09D 11/101 | (2014.01) | |
| C09D 11/38 | (2014.01) | |
| G03F 7/028 | (2006.01) | |

(52) U.S. Cl.
CPC .......... *C08F 120/18* (2013.01); *C09D 11/101* (2013.01); *C09D 11/38* (2013.01); *G03F 7/028* (2013.01)

(58) Field of Classification Search
CPC ..... C09D 11/38; C09D 11/106; C09D 11/101; C09D 11/102; G03F 7/028; G03F 7/027; G03F 7/033; C08F 120/18
See application file for complete search history.

(56) References Cited

U.S. PATENT DOCUMENTS

| | | | |
|---|---|---|---|
| 8,703,892 B2 | 4/2014 | Kodama | |
| 9,663,671 B2 | 5/2017 | Enomoto | |
| 10,509,313 B2 | 12/2019 | Liu | |
| 2015/0075855 A1 | 3/2015 | Ito | |
| 2017/0371240 A1* | 12/2017 | Liu | G03F 7/0046 |

FOREIGN PATENT DOCUMENTS

TW    201808584 A    3/2018

OTHER PUBLICATIONS

Nargang, T. M., et al. (2014). Liquid polystyrene: a room-temperature photocurable soft lithography compatible pour-and-cure-type polystyrene. Lab Chip, 14, 2698-2708; Published: May 7, 2014 (Year: 2014).*

* cited by examiner

*Primary Examiner* — Mark F. Huff
*Assistant Examiner* — Richard David Champion
(74) *Attorney, Agent, or Firm* — Abel Schillinger, LLP

(57) ABSTRACT

A photocurable composition can comprise a polymerizable material, at least one non-reactive polymer, and a photoinitiator, wherein the non-reactive polymer can have a carbon content of at least 80% based on the total weight of the non-reactive polymer; a molecular weight of the at least one non-reactive polymer can be at least 750 g/mol and not greater than 20,000 g/mol; an amount of the non-reactive polymer may be at least 10 wt % and not greater than 30 wt %; and a viscosity of the photocurable composition may be not greater than 110 mPa·s. The photocurable composition may have a low linear shrinkage after curing, a high carbon content and high etch resistance and being suitable for AIP or NIL processing.

20 Claims, 2 Drawing Sheets

PHOTOCURABLE COMPOSITION INCLUDING A NON-REACTIVE POLYMER

FIELD OF THE DISCLOSURE

The present disclosure relates to a photocurable composition, particularly to a photo-curable composition for inkjet adaptive planarization adapted for forming photo-cured layers having a high carbon content, low thermal shrinkage, and high thermal stability.

BACKGROUND

Inkjet Adaptive Planarization (IAP) is a process which planarizes a surface of a substrate, e.g., a wafer containing an electric circuit, by jetting liquid drops of a photocurable composition on the surface of the substrate, and bringing a flat superstrate in direct contact with the added liquid to form a flat liquid layer. The flat liquid layer is typically solidified under UV light exposure, and after removal of the superstrate a planar polymeric surface is obtained, which can be subjected to subsequent processing steps, for example baking, etching, and/or further deposition steps.

There exists a need for improved IAP materials leading to planar photo-cured layers with a high etch resistance, high thermal stability, and low shrinkage during subsequent processing.

SUMMARY

In one embodiment, a photocurable composition can comprise a polymerizable material, at least one non-reactive polymer, and a photoinitiator, wherein the non-reactive polymer can have a carbon content of at least 80% based on the total weight of the total weight of the non-reactive polymer; a molecular weight of the at least one non-reactive polymer can be at least 750 g/mol and not greater than 20,000 g/mol; an amount of the non-reactive polymer may be at least 10 wt % and not greater than 30 wt %; and a viscosity of the photocurable composition may be not greater than 110 mPa·s In one aspect, the photocurable composition can be adapted that a linear shrinkage of the photocurable composition after photo-curing may be not greater than 6 percent. In a particular aspect, the linear shrinkage may be not greater than 5 percent.

In another aspect, the viscosity of the photocurable composition can be not greater than 50 mPa·s.

In a further aspect, the carbon content of the non-reactive polymer can be at least 85 percent.

In one embodiment, the non-reactive polymer may be soluble in the polymerizable material.

In yet another embodiment of the photocurable composition, the molecular weight of the non-reactive polymer can be at least 750 g/mol and not greater than 10,000 g/mol. In a particular embodiment, the molecular weight can be at least 2,000 g/mol and not greater than 8,000 g/mol.

In a certain aspect of the photocurable composition, the amount of the non-reactive polymer may be not greater than 25 wt % based on the total weight of the photocurable composition.

In one aspect of the photocurable composition, the non-reactive polymer can be selected from polystyrene, polyphenylene oxide, or dicyclopentadiene phenol resin.

In another aspect of the photocurable composition, the amount of the polymerizable material can be at least 50 wt % based on the total weight of the photocurable composition.

In a further aspect, the polymerizable material of the photocurable composition can comprise at least one polymerizable monomer, the at least one polymerizable monomer having a boiling point of at least 250° C.

In yet another aspect, the polymerizable material of the photocurable composition can include at least one multi-functional acrylate monomer, or at least one multi-functional vinyl monomer, or a combination thereof.

In a certain aspect of the photocurable composition, the polymerizable material can include at least one mono-functional acrylate monomer and at least one multi-functional acrylate monomer.

In one embodiment, the photocurable composition can be adapted for nanoimprint lithography (NIL) or inkjet adaptive planarization (IAP).

In another embodiment of the photocurable composition, the total carbon content of a photo-cured layer formed from the photocurable composition can have a carbon content of at least 70%.

In a further embodiment, the thermal decomposition temperature of the photocurable composition after photo-curing can be at least 300° C.

In one embodiment, a method of forming a photo-cured layer on a substrate, can comprise: applying a layer of a photocurable composition on the substrate, wherein the photocurable composition comprises a polymerizable material, a non-reactive polymer and a photoinitiator, wherein the non-reactive polymer can have a carbon content of at least 80 wt % based on the total weight of the polymer; a molecular weight of the at least one non-reactive polymer can be at least 750 g/mol and not greater than 20,000 g/mol; an amount of the non-reactive polymer may be at least 10 wt % and not greater than 30 wt %; and a viscosity of the photocurable composition may be not greater than 110 mPa·s; bringing the photocurable composition into contact with a template or a superstrate; irradiating the photocurable composition with light to form a photo-cured layer; and removing the template or the superstrate from the photo-cured layer.

In one aspect of the method, the linear thermal shrinkage of a layer of the photocurable composition after photo-curing may be not greater than 6 percent.

In a further embodiment, a method of manufacturing an article can comprise: applying a layer of a photocurable composition on a substrate, wherein the photocurable composition comprises a polymerizable material, a non-reactive polymer and a photoinitiator, wherein the non-reactive polymer can have a carbon content of at least 80 wt % based on the total weight of the polymer; a molecular weight of the at least one non-reactive polymer can be at least 750 g/mol and not greater than 20,000 g/mol; an amount of the non-reactive polymer is at least 10 wt % and not greater than 30 wt %; and a viscosity of the photocurable composition is not greater than 100 mPa·s; bringing the photocurable composition into contact with a template or a superstrate; irradiating the photocurable composition with light to form a photo-cured layer; removing the template or the superstrate from the photo-cured layer; forming a pattern on the substrate; processing the substrate on which the pattern has been formed in the forming; and manufacturing an article from the substrate processed in the processing.

BRIEF DESCRIPTION OF THE DRAWINGS

Embodiments are illustrated by way of example and are not limited in the accompanying figures.

DETAILED DESCRIPTION

Figure 1:
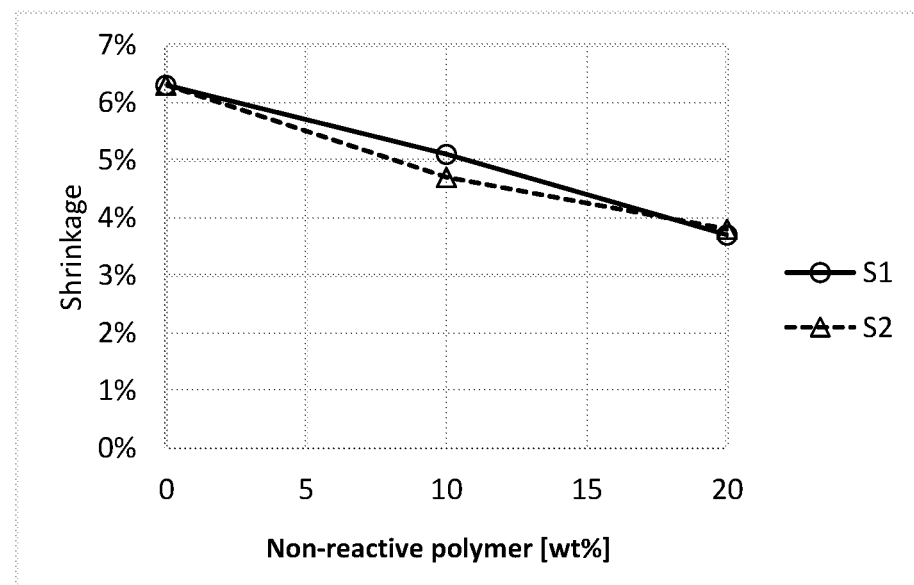
FIG. 1 includes a graph illustrating the reduction of the linear shrinkage with increasing amount of non-reactive polymer according to embodiments.

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a photocurable composition comprising a polymerizable material, at least one non-reactive polymer, and a photoinitiator, wherein the non-reactive polymer can have a carbon content of at least 80%; a molecular weight of the at least one non-reactive polymer may be at least 750 g/mol and not greater than 20,000 g/mol; and an amount of the non-reactive polymer can be at least 10 wt % and not greater than 30 wt %.

It has been surprisingly observed that photocurable compositions comprising certain combinations of polymerizable material with at least one non-reactive polymer can allow the forming of photo-cured layers having a low thermal shrinkage.

Not being bound to theory, it is assumed that the non-reactive polymer can be implemented during polymerization of the polymerizable material within formed pores of the polymeric matrix and may prevent collapse of the pores and thereby avoidance of shrinkage. The right balance of the type and amount of non-reactive polymer and the type and amount of the monomers of the polymerizable monomers can facilitate the forming of highly suitable resist material for NIL or IAP processing, having a low viscosity, high carbon content, low Ohnishi number, high thermal stability, and high etch resistance.

As used herein, the term "non-reactive" polymer relates to a polymer which does not chemically react with the functional groups of the polymerizable monomers of the polymerizable material. For example, in one aspect, the non-reactive polymer does not contain functional groups which can react with acrylate groups or vinyl groups of the polymerizable monomers.

As used herein, the linear shrinkage (SL) is calculated by equation (1):

$$SL=(L_R-L_{CR}/L_R)\times 100\% \quad (1),$$

wherein $L_R$ is the thickness of the photocurable composition layer before curing and $L_{CR}$ is the thickness of the cured photocurable composition layer.

In a certain embodiment, the linear shrinkage of the photocurable composition can be not greater than 6%, such as not greater than 5.5%, not greater than 5.0%, not greater than 4.5%, not greater than 4.0%, not greater than 3.5%, or not greater than 3.0%.

The non-reactive polymer can be selected by criteria of having a high carbon content, being soluble in the polymerizable material, having a certain molecular weight range, and providing only a minor contribution to a viscosity increase of the photocurable composition.

A high carbon content of the non-reactive polymer is desired in order to contribute to a high final carbon content of the photo-cured layer formed from the photocurable composition. In one aspect, the carbon content of the non-reactive polymer can be at least 80% based on the total weight of the non-reactive polymer, such as at least 82%, or at least 84%, or at least 86%, or at least 88%, or at least 90%, or at least 92%. The carbon content of the non-reactive polymer can be calculated as the weight percent of carbon atoms based on the molecular weight of the smallest repeating unit of the non-reactive polymer.

Non-limiting examples of non-reactive polymers can include polystyrene, poly(phenylene oxide), dicyclopentadiene phenol resin, poly(p-phenylene), poly(vinyl biphenyl), poly(vinyl anthracene), poly(vinylcyclohexane), poly(l-vinyladamanthane), or poly(ether ketone) (PEEK).

In certain aspects, the molecular weight of the non-reactive polymer can be at least 750 g/mol, or at least 800 g/mol, or at least 1,000 g/mol, or at least 2,000 g/mol, or at least 5,000 g/mol. In other aspects, the molecular weight of the non-reactive polymer may be not greater than 50,000 g/mol, or not greater than 20,000 g/mol, or not greater than 15,000 g/mol, or not greater than 10,000 g/mol, or not greater than 8,000 g/mol, or not greater than 6,000 g/mol.

In a further aspect, the amount of the non-reactive polymer can be at least 5 wt % based on the total weight of the photocurable composition, such as at least 10 wt %, or at least 15 wt %, or at least 20 wt %. In another aspect, the amount of the non-reactive polymer may be not greater than 30 wt % based on the total weight of the photocurable composition, or not greater than 25 wt %, or not greater than 20 wt %.

The photocurable composition can be designed of having a low viscosity before curing. In one embodiment, the viscosity of the curable composition can be not greater than 110 mPa·s, or not greater than 100 mPa·s, or not greater than 80 mPa·s, or not greater than 50 mPa·s, or not greater than 40 mPa·s, or not greater than 35 mPa·s, or not greater than 30 mPa·s, or not greater than 25 mPa·s, or not greater than 20 mPa·s, or not greater than 15 mPa·s. In other certain embodiments, the viscosity may be at least 5 mPa·s, such as at least 10 mPa·s, or at least 15 mPa·s. In a particularly preferred aspect, the photocurable composition can have a viscosity from 10 mPa·s to not greater than 50 mPa·s. As used herein, all viscosity values relate to viscosities measured at a temperature of 23° C. with the Brookfield method using a Brookfield Viscometer.

The polymerizable material can include mono-functional monomers, multi-functional monomers, or a combination thereof. In a particular aspect the polymerizable material can include at least one multi-functional acrylate monomer, or at least one multi-functional vinyl monomer, or a combination of multi-functional acrylate monomer and multi-functional vinyl monomer.

In certain aspects, the multi-functional acrylate monomer of the polymerizable material can be a bi-functional acrylate monomer, a tri-functional acrylate monomer, a tetra-functional acrylate monomer, or any combination thereof. Non-limiting examples of multi-functional acrylate monomers can be bisphenol A dimethacrylate, m-xylylene diacrylate, neopentyl glycol diacrylate, trimethylolpropane triacrylate, tetramethylolmethane tetraacrylate, or any combination thereof.

In another certain aspect, the multi-functional vinyl monomer can be divinylbenzene.

In a further particular aspect, the polymerizable material can include at least one mono-functional acrylate monomer and at least one multi-functional acrylate monomer. As used herein the term acrylate monomer relates to both unsubstituted and alkyl-substituted acrylates, for example, methacrylate.

In another aspect, the amount of the multi-functional monomer can be at least 10 wt %, or at least 15 wt %, or at least 20 wt %, or at least 30 wt %, or at least 50 wt %, or at least 80 wt % based on the total weight of the polymerizable material. In another aspect, the amount of the multi-functional monomer may be 100% of the polymerizable material, or not greater than 95 wt %, or not greater than 90 wt % based, or not greater than 70 wt %, or not greater than 50 wt % based on the total weight of the polymerizable material.

In yet a further aspect, a weight % ratio of the mono-functional monomer to the multi-functional monomer can be from 1:5 to 5:1, such as from 1:3 to 3:1, or from 1:1 to 3:1.

The amount of polymerizable material in the photocurable composition can be at least 30 wt % based on the total weight of the photocurable composition, such as at least 40 wt %, at least 50 wt %, or at least 60 wt %, or at least 70 wt %, or at least 80 wt %. In another aspect, the amount of polymerizable compound may be not greater than 90 wt %, such as not greater than 85 wt %, or not greater than 80 wt %, or not greater than 70 wt %, or not greater than 60 wt %. The amount of the polymerizable compound can be a value between any of the minimum and maximum values noted above. In a particular aspect, the amount of the polymerizable material can be at least 50 wt % and not greater than 85 wt %.

The photocurable composition can be adapted that a photo-cured layer formed from the photocurable composition may have a high thermal stability. In one aspect, an onset temperature for the thermal degradation of the of the photo-cured layer may be greater than 250° C., or greater than 300° C., or greater than 350° C., or greater than 375° C., or greater than 400° C. As used herein, the onset thermal degradation temperature is also called "thermal degradation temperature," and relates to the temperature in the TGA curve wherein a deflection of the curve from the almost linear plateau is first observed, shortly before the steep degradation decline of the sample.

In one embodiment, the photocurable composition of the present disclosure can be essentially free of a solvent. As used herein, if not indicated otherwise, the term solvent relates to a compound which can dissolve or disperse the polymerizable monomers but does not itself polymerize during the photo-curing of the photocurable composition. The term "essentially free of a solvent" means herein an amount of solvent being not greater than 5 wt % based on the total weight of the photocurable composition. In a certain particular aspect, the amount of the solvent can be not greater than 3 wt %, not greater than 2 wt %, not greater than 1 wt %, or the photocurable composition can be free of a solvent, except for unavoidable impurities.

In another particular aspect, the photocurable composition can include a solvent in an amount of at least 6 wt % based on the total weight of the photocurable composition, or at least 8 wt %, at least 10 wt %, at least 15 wt %, or at least 20 wt %. In another aspect the amount of solvent may be not greater than 30 wt %, or not greater than 20 wt %, or not greater than 15 wt %.

In order to initiate the photo-curing of the composition if exposed to light, one or more photoinitiators can be included in the photocurable composition. In a certain aspect, the curing can be also conducted by a combination of light and heat curing.

The photocurable composition can further contain one or more optional additives. Non-limiting examples of optional additives can be stabilizers, dispersants, solvents, surfactants, inhibitors, or any combination thereof.

The photocurable composition of the present disclosure can be adapted for use in inkjet adaptive planarization (IAP) or in nanoimprint lithography (NIL).

In one embodiment, the photocurable composition can be applied on a substrate to form a photo-cured layer. As used herein, the combination of substrate and photo-cured layer overlying the substrate is called a laminate.

The inclusion of the at least one first monomer of the polymerizable material can contribute to a high carbon content in the formed photo-cured layer. In one embodiment, the photocurable composition can be adapted that a carbon content of the photo-cured layer may be at least 70%, or at least 71%, at least 72%, at least 73%, at least 74%, or at least 75%.

In another aspect, the photo-cured layer of the laminate can have an Ohnishi number of not greater than 3.2, or not greater than 3.0, or not greater than 2.9, or not greater than 2.8, or not greater than 2.7, or not greater than 2.6. In another aspect, the Ohnishi number may be at least 1.8, such as at least 1.9, at least 2.0, at least 2.1, at least 2.2, or at least 2.3.

In a particular embodiment, the photo-cured layer can have a carbon content of at least 70% and an Ohnishi number of not greater than 2.9.

The present disclosure is further directed to a method of forming a photo-cured layer. The method can comprise applying a layer of the photocurable composition described above over a substrate, bringing the photocurable composition into contact with a template or superstrate; irradiating the photocurable composition with light to form a photo-cured layer; and removing the template or the superstrate from the photo-cured layer.

The substrate and the solidified layer may be subjected to additional processing, for example, an etching process, to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

Suitable non-reactive polymers:

Table 1 summarizes the structures and properties of three non-reactive polymers suitable for the photocurable compositions of the present disclosure: 1) polystyrene (Polystyrene standard from Scientific Polymer Products, Inc.), having an average molecular weight of 2400 g/mol, which is herein also called "PS 2400"; 2) dicyclopentadiene phenol resin (ERM-6140 from Songwon International-Americas, Inc.), having an average molecular weight of about 775 g/mol, herein also called "DPR 775;" and 3) polyphenylene oxide having an average molecular weight of about 6300 g/mol.

polymerizable material m-xylylene diacrylate (mXDA) and 2 wt % of photoinitiator Omnirad 907 and 1 wt % of surfactant Pluronic L44.

The photocurable compositions have been prepared with 10 wt % and 20 wt % non-reactive polymer, while the amount of the polymerizable material (mXDA) was the balance to 100 wt %, next to the photoinitiator and surfactant.

As comparative sample (C1) was used the respective photocurable composition not containing a non-reactive polymer, i.e., m-xylylene diacrylate (mXDA) as the polymerizable material, and the photoinitiator and surfactant.

Measuring of the Linear Shrinkage

Shrinkage measurements were performed with an Anton Paar MCR-301 rheometer coupled to an UV curing system and heater. For the testing, a drop of 7 µl of the resist composition was added onto a plate and a temperature control hood was released to insulate the drop and the measuring unit. The amount of resist was designed to obtain a thickness (hereinafter also called height) of the resist layer of slightly higher than 0.1 mm. By pre-setting the target height to 0.1 mm, the measuring unit moved down to the set value, causing extra amount of resist flowing off the plate. This insured that the exact height of the liquid resist was 0.1 mm before curing. Thereafter, the resist was cured with a UV power of 100 mW/cm² at 365 nm for 600 seconds. After curing of the resist, the height was measured again and the linear shrinkage calculated according to equation (1).

TABLE 1

| Name | Structure | Molecular Weight | Carbon Content [%] |
|---|---|---|---|
| Polystyrene (PS2400) | [polystyrene repeat unit structure] | ≈ 2400 | 92.3 |
| Dicyclopentadiene phenol resin (DPR 775) | [dicyclopentadiene phenol resin structure] | ≈ 775 | 93.9 |
| Polyphenylene oxide (PPO6300) | [polyphenylene oxide structure with CH₃ groups] | ≈ 6300 | 80 |

Preparing of photocurable TAP compositions:

Two different types of photocurable compositions were prepared including as non-reactive polymer 1) polystyrene (PS 2400); and 2) dicyclopentadiene phenol resin (DPR 775). Both types of photocurable compositions contained as A summary of the measured linear shrinkages is shown in Table 2 and FIG. 1. It can be seen that both types of non-reactive polymers reduced the linear shrinkage with increasing amounts of non-reactive polymer in a similar manner. An amount of 10 wt % of the non-reactive polymers reduced the linear shrinkage by about 1.5%, which was further increased to about 2.5 wt % shrinkage reduction at an amount of 20 wt %, if compared to the shrinkage of sample C1.

TABLE 2

| Sample | Non-reactive Polymer | Amount of non-reactive Polymer [wt %] | Viscosity [mPa s] | Carbon Content [%] | Linear Shrinkage [%] |
|---|---|---|---|---|---|
| C1 | — | — | 11.0 | 68.3 | 6.4 |
| S1 | PS 2400 | 10 | 21.2 | 70.7 | 5.0 |
| S1 | PS 2400 | 20 | 48.0 | 73.1 | 3.7 |
| S2 | DPR 775 | 10 | 28.7 | 69.8 | 4.8 |
| S2 | DPR 775 | 20 | 105.3 | 71.4 | 3.8 |

Measurement of the Thermal Stability

Photo-cured layers were prepared from the photocurable compositions summarized in Table 2 by adding the respective resist composition between two glass slides, the two glass slides having a distance of 300 microns to each other. The resist between the glass slides was photo-cured by applying a radiation energy of 2.4 J/cm$^2$.

The photo-cured layers were analyzed via thermographical analysis (TGA). The TGA was conducted using a LINSEIS STA PT1000 instrument (Linseis Messgeraete GmbH, Germany). All measurements were conducted under nitrogen at a rate of 5 liter per hour. The samples (about 25 mg per test) were heated at a rate of 20° C./minute and the loss of weight was continually recorded.

Figure 2:
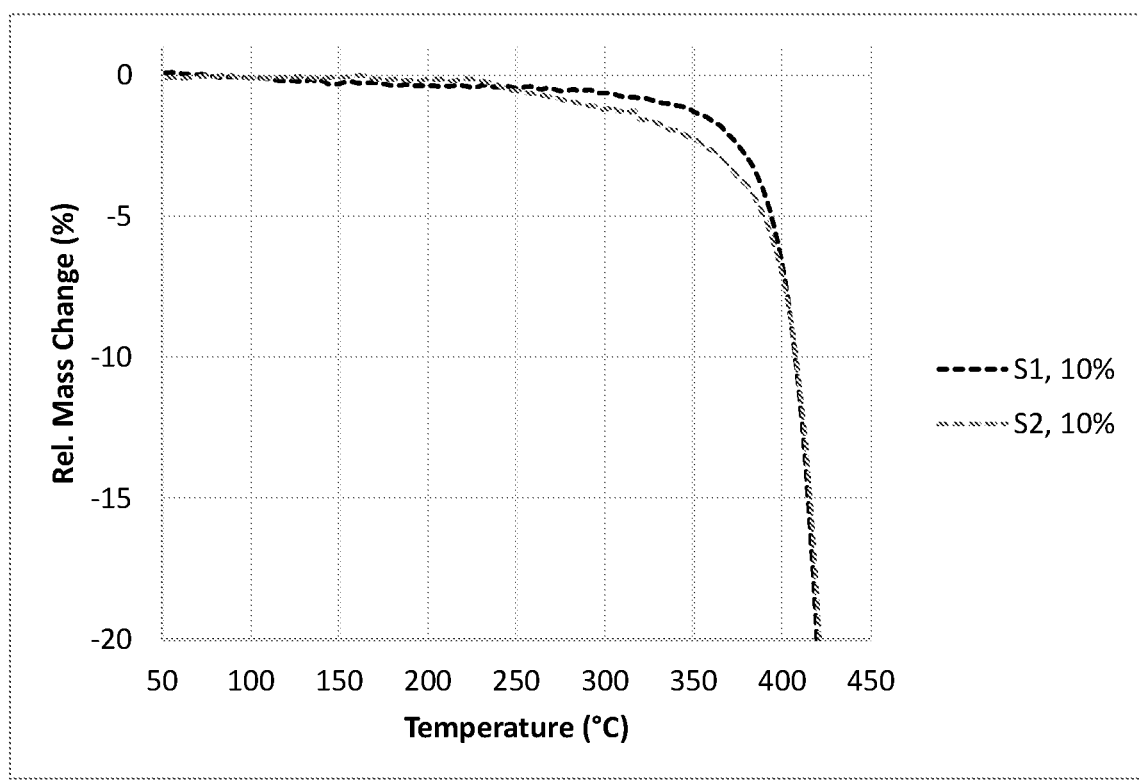
FIG. 2 includes a graph illustrating TGA curves of the materials of photo-cured layers made from compositions S1 and S2, each formed with an amount of 10 wt % of the non-reactive polymer according to embodiments.

The TGA curves of the materials of photo-cured layers made from compositions S1 and S2, each formed with an amount of 10 wt % of the non-reactive polymer are shown in FIG. 2. It can be seen that all tested materials had thermal degradation temperatures greater than 300° C.

As used herein, the thermal degradation temperature relates to the initial degradation temperature T(X), which is the temperature of the TGA curve wherein a deflection of the curve from the almost linear plateau shape is first observed, shortly before the steep decline of the mass of the sample, i.e., degradation.

Viscosities

Table 2 also lists the measured viscosities of the photocurable compositions. It can be seen that the inclusion of 10 wt % kept the viscosities of both compositions S1 and S2 below 30 mPa·s. Adding 20 wt % increased the viscosity for S1 (including polystyrene) to a value of 48 mPa·s, while Sample S2 containing 20 wt % DPR 775 had a much higher viscosity increase to about 105 mPa·s.

The viscosities were measured at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

Carbon Content and Ohnishi Number

Table 3 shows for the listed photocurable compositions the calculated carbon content and the calculated Ohnishi numbers (ON) contained in the photo-cured layers after curing.

For the carbon content calculations, it was assumed that the polymerizable material together with the non-reactive polymer amounts to 100% of the layer material, and the carbon content was calculated based on the calculated weight of all ingredients per mol, wherein "%" stands for the weight percent of the carbon of the layer material. The calculated carbon content should be very close to the actual carbon content, since there is no material loss, such as forming a gas or water during the curing.

The Ohnishi number (ON) is known to be an empirical parameter and calculated as the ratio of total number of atoms ($N_t$) in the polymer repeat unit divided by the difference between the number of carbon atoms ($N_C$) and oxygen atoms ($N_O$) in the unit, $ON=N_t/(N_C-N_O)$. For the calculation of the Ohnishi number, it was assumed that the cured materials contained 100 wt % of the polymerized monomer units formed by addition polymerization (no loss of atoms during polymerizations). A decrease of the Ohnishi number can correspond to an increase of the etch resistance.

TABLE 3

| Sample | Non-reactive Polymer | Carbon Content of non-reactive polymer [%] | Amount of non-reactive Polymer [wt %] | Carbon Content of photo-cured layer [%] | Ohnishi Number |
|---|---|---|---|---|---|
| C1 | — | — | — | 68.3 | 3.20 |
| S1 | PS 2400 | 92.3 | 10 | 70.7 | 3.08 |
| S1 | PS 2400 | 92.3 | 20 | 73.1 | 2.96 |
| S2 | DPR 775 | 83.9 | 10 | 69.8 | 3.12 |
| S2 | DPR 775 | 83.9 | 20 | 71.4 | 3.03 |

It can be seen that the addition of 10 wt % polystyrene (PS 2400) increases the carbon content of the formed photocured layer of 51 by about 2.5 percent, and the addition of 20 wt % PS 2400 increases the carbon content by 5 percent.

A carbon content increase can be also seen by the presence of 10 wt % and 20 wt % of dicyclopentadiene phenol resin (DPR 775) in the photocurable composition S2, being about 1.5 percent for 10 wt % DPR 775, and about 3 percent at an amount of 20 wt %.

A high carbon content is desired in the photocured layers of the present disclosure, since an increase in the carbon content can correlate with an increase of the etch resistance of the photo-cured layer and thermal stability.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A photocurable composition comprising a polymerizable material, at least one non-reactive polymer, and a photoinitiator, wherein
the non-reactive polymer has a carbon content of at least 80% based on the total weight of the non-reactive polymer;
a molecular weight of the at least one non-reactive polymer is at least 750 g/mol and not greater than 20,000 g/mol;
an amount of the non-reactive polymer is at least 10 wt % and not greater than 30 wt %; and
a viscosity of the photocurable composition is not greater than 110 mPa·s.

2. The photocurable composition of claim 1, wherein the photocurable composition is adapted that a linear shrinkage of the photocurable composition after photo-curing is not greater than 6 percent.

3. The photocurable composition of claim 2, wherein the linear shrinkage is not greater than 5 percent.

4. The photocurable composition of claim 1, wherein the viscosity of the photocurable composition is not greater than 50 mPa·s.

5. The photocurable composition of claim 1, wherein the carbon content of the non-reactive polymer is at least 85 percent.

6. The photocurable composition of claim 1, wherein the non-reactive polymer is soluble in the polymerizable material.

7. The photocurable composition of claim 1, wherein the molecular weight of the non-reactive polymer is at least 750 g/mol and not greater than 10,000 g/mol.

8. The photocurable composition of claim 7, wherein the molecular weight of the non-reactive polymer is at least 2,000 g/mol and not greater than 8,000 g/mol.

9. The photocurable composition of claim 1, wherein the amount of the non-reactive polymer is not greater than 25 wt % based on the total weight of the photocurable composition.

10. The photocurable composition of claim 1, wherein the non-reactive polymer is selected from polystyrene, polyphenylene oxide, or dicyclopentadiene phenol resin.

11. The photocurable composition of claim 1, wherein an amount of the polymerizable material is at least 50 wt % based on the total weight of the photocurable composition.

12. The photocurable composition of claim 1, wherein the polymerizable material comprises at least one polymerizable monomer, the at least one polymerizable monomer having a boiling point of at least 250° C.

13. The photocurable composition of claim 1, wherein the polymerizable material includes at least one multi-functional acrylate monomer, at least one multi-functional vinyl monomer, or a combination thereof.

14. The photocurable composition of claim 1, wherein the polymerizable material includes at least one mono-functional acrylate monomer and at least one multi-functional acrylate monomer.

15. The photocurable composition of claim 1, wherein the photocurable composition is adapted for nanoimprint lithography (NIL) or inkjet adaptive planarization (IAP).

16. The photocurable composition of claim 1, wherein a total carbon content of a photo-cured layer formed from the photocurable composition has a carbon content of at least 70%.

17. The photocurable composition of claim 1, wherein a thermal decomposition temperature of the photocurable composition after photo-curing is at least 300° C.

18. A method of forming a photo-cured layer on a substrate, comprising:
applying a layer of a photocurable composition on the substrate, wherein the photocurable composition comprises a polymerizable material, a non-reactive polymer and a photoinitiator, wherein the non-reactive polymer has a carbon content of at least 80 wt % based on the total weight of the polymer; a molecular weight of the at least one non-reactive polymer is at least 750 g/mol and not greater than 20,000 g/mol; an amount of the non-reactive polymer is at least 10wt % and not greater than 30 wt %; and a viscosity of the photocurable composition is not greater than 110 mPa·s;
bringing the photocurable composition into contact with a template or a superstrate;
irradiating the photocurable composition with light to form a photo-cured layer; and
removing the template or the superstrate from the photo-cured layer.

19. The method of claim 18, wherein a linear thermal shrinkage of the layer of the photocurable composition after forming the photo-cured layer is not greater than 6 percent.

20. A method of manufacturing an article, comprising:
applying a layer of a photocurable composition on a substrate, wherein the photocurable composition comprises a polymerizable material, a non-reactive polymer and a photoinitiator, wherein the non-reactive polymer has a carbon content of at least 80 wt % based on the total weight of the polymer; a molecular weight of the at least one non-reactive polymer is at least 700 g/mol and not greater than 20,000 g/mol; an amount of the non-reactive polymer is at least 10wt % and not greater than 30 wt %; and a viscosity of the photocurable composition is not greater than 110 mPa·s;
bringing the photocurable composition into contact with a template or a superstrate;
irradiating the photocurable composition with light to form a photo-cured layer;
removing the template or the superstrate from the photo-cured layer;
forming a pattern on the substrate;
processing the substrate on which the pattern has been formed in the forming; and
manufacturing an article from the substrate processed in the processing.

* * * * *